United States Patent
Zhou et al.

(10) Patent No.: US 10,389,485 B2
(45) Date of Patent: Aug. 20, 2019

(54) CHANNEL ENCODING AND DECODING METHOD AND DEVICE IN WIRELESS COMMUNICATIONS

(71) Applicant: HUAWEI TECHNOLOGIES CO., LTD., Shenzhen, Guangdong (CN)

(72) Inventors: Yue Zhou, Hangzhou (CN); Yinggang Du, Shenzhen (CN); Rong Li, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/110,908

(22) Filed: Aug. 23, 2018

(65) Prior Publication Data

US 2018/0367251 A1    Dec. 20, 2018

Related U.S. Application Data

(63) Continuation of application No. PCT/CN2017/101409, filed on Sep. 12, 2017.

(30) Foreign Application Priority Data

Oct. 25, 2016    (CN) .......................... 2016 1 0938509

(51) Int. Cl.
*H03M 13/00* (2006.01)
*H04L 1/00* (2006.01)
(Continued)

(52) U.S. Cl.
CPC ........ *H04L 1/0058* (2013.01); *H03M 13/091* (2013.01); *H03M 13/13* (2013.01);
(Continued)

(58) Field of Classification Search
CPC .......................... H04L 1/0058; H04L 1/0041
See application file for complete search history.

(56) References Cited

U.S. PATENT DOCUMENTS 9,083,387 B2 * 7/2015 Mahdavifar .......... H03M 13/13
9,130,712 B2   9/2015 Blankenship et al.
(Continued)

FOREIGN PATENT DOCUMENTS

CN     1711734 A   12/2005
CN   101667884 A    3/2010
(Continued)

OTHER PUBLICATIONS

3GPP TS 36.213 V14.0.0 (Sep. 2016),3rd Generation Partnership Project;Technical Specification Group Radio Access Network;Evolved Universal Terrestrial Radio Access (E-UTRA);Physical layer procedures(Release 14),total 404 pages.
(Continued)

*Primary Examiner* — Esaw T Abraham
(74) *Attorney, Agent, or Firm* — Huawei Technologies Co., Ltd.

(57) ABSTRACT

Embodiments of this application provide an encoding and decoding method and device in wireless communications between network devices and user equipment. The encoding method includes: obtaining, by a transmit end, a post-polar-encoding data length corresponding to to-be-encoded data; segmenting, by the transmit end, the to-be-encoded data into at least one code block based on the post-encoding data length and a preset threshold; and performing, by the transmit end, polar encoding on each code block, and transmitting encoded data to a receive end. The embodiments of this application avoid a data transmission performance loss caused by an excessive quantity of segments.

20 Claims, 5 Drawing Sheets

(51) Int. Cl.
  *H03M 13/09* (2006.01)
  *H03M 13/13* (2006.01)
  *H03M 13/29* (2006.01)

(52) U.S. Cl.
  CPC ..... *H03M 13/2906* (2013.01); *H03M 13/635* (2013.01); *H03M 13/6516* (2013.01); *H03M 13/6525* (2013.01); *H04L 1/0041* (2013.01); *H03M 13/09* (2013.01)

(56) References Cited

U.S. PATENT DOCUMENTS

| | | | |
|---|---|---|---|
| 9,628,113 B2* | 4/2017 | Jeong | H03M 13/2906 |
| 9,667,381 B2* | 5/2017 | Jeong | H04L 1/0046 |
| 9,742,440 B2* | 8/2017 | El-Khamy | H03M 13/6368 |
| 9,768,915 B2* | 9/2017 | Kim | H03M 13/09 |
| 9,917,675 B2* | 3/2018 | Kudekar | H04L 1/0057 |
| 9,941,906 B2* | 4/2018 | Hof | H03M 13/2924 |
| 2015/0263767 A1 | 9/2015 | Shin et al. | |
| 2016/0013810 A1 | 1/2016 | Gross et al. | |
| 2016/0218743 A1 | 7/2016 | Li et al. | |
| 2016/0269050 A1* | 9/2016 | Shen | H03M 13/13 |
| 2016/0308643 A1 | 10/2016 | Li et al. | |
| 2018/0026747 A1 | 1/2018 | Rong et al. | |

FOREIGN PATENT DOCUMENTS

| | | |
|---|---|---|
| CN | 102315911 A | 1/2012 |
| CN | 103825669 A | 5/2014 |
| CN | 104124979 A | 10/2014 |
| CN | 105009461 A | 10/2015 |
| CN | 105227189 A | 1/2016 |
| CN | 105933010 A | 9/2016 |
| EP | 2922227 A1 | 9/2015 |
| WO | 2009022874 A1 | 2/2009 |
| WO | 2010118592 A1 | 10/2010 |
| WO | 2016154968 A1 | 10/2016 |

OTHER PUBLICATIONS

3GPP TS 36.212 V14.0.0 (Sep. 2016),3rd Generation Partnership Project;Technical Specification Group Radio Access Network;Evolved Universal Terrestrial Radio Access (E-UTRA);Multiplexing and channel coding(Release 14),total 148 pages.

3GPP TS 36.211 V14.0.0 (Sep. 2016),3rd Generation Partnership Project;Technical Specification Group Radio Access Network;Evolved Universal Terrestrial Radio Access (E-UTRA);Physical channels and modulation(Release 14),total 171 pages.

3GPP TS 38.212 V0.0.0 (May 2017),3rd Generation Partnership Project;Technical Specification Group Radio Access Network;NR;Multiplexing and channel coding(Release 15),total 10 pages.

3GPP TSG-RAN WG1 #84bis, R1-163274,Nokia, Alcatel-Lucent Shanghai Bell:"Evaluation methodology for 5G new radio channel coding", Busan, Korea, Apr. 11-15, 2016. 4 pages. XP51079800.

* cited by examiner

CHANNEL ENCODING AND DECODING METHOD AND DEVICE IN WIRELESS COMMUNICATIONS

CROSS-REFERENCE TO RELATED APPLICATIONS

This application is a continuation of International Application No. PCT/CN2017/101409, filed on Sep. 12, 2017, which claims priority to Chinese Patent Application No. 201610938509.X, filed on Oct. 25, 2016. The disclosures of the aforementioned applications are hereby incorporated by reference in their entireties.

TECHNICAL FIELD

This application relates to the field of technical communications technologies, and in particular, to an encoding and decoding method and device.

BACKGROUND

In a turbo encoding processing process of a Long Term Evolution (LTE) system, once a length of a transport block (TB) exceeds a maximum input bit length of a turbo encoder (that is, a maximum size of a turbo code interleaver), the TB block needs to be segmented into several relatively short code blocks, so that a length of each code block can fit the maximum interleaver size, so as to complete encoding processing for each code block. A cyclic redundancy check (CRC) bit and a padding bit are added to the code block. In a code block segmentation process, all padding bits are always added in a starting position of the first code block.

Due to the restriction of the turbo code interleaver, a large quantity of turbo codes have to be segmented into a plurality of code segments, resulting in an unnecessary performance loss.

SUMMARY

Embodiments of this application provide an encoding and decoding method and device, so as to avoid a data transmission performance loss caused by an excessive quantity of segments.

According to a first aspect, an embodiment of this application provides an encoding method, including: obtaining, by a transmit end, a post-polar-encoding data length corresponding to to-be-encoded data, where the to-be-encoded data may be a transport block TB, and the transport block includes a TB-level CRC code; segmenting, by the transmit end, the to-be-encoded data into at least one code block based on the post-encoding data length and a preset threshold; and when the transmit end segments the to-be-encoded data into one code block, that is, when the to-be-encoded data is not segmented, performing, by the transmit end, polar encoding on each code block, and transmitting encoded data to a receive end.

In a possible design, the segmenting, by the transmit end, the to-be-encoded data into at least one code block based on the post-encoding data length and a preset threshold includes:

obtaining, by the transmit end, a segment quantity of the to-be-encoded data based on the post-encoding data length and the preset threshold; and segmenting, by the transmit end, the to-be-encoded data into at least one code block based on the segment quantity.

In a possible design, the segmenting, by the transmit end, the to-be-encoded data into at least one code block based on the post-encoding data length and a preset threshold includes:

determining, by the transmit end, whether the post-encoding data length is greater than the preset threshold; and if the post-encoding data length is greater than the preset threshold, obtaining, by the transmit end, a segment quantity of the to-be-encoded data based on the post-encoding data length and the preset threshold, and segmenting the to-be-encoded data into at least two code blocks based on the segment quantity; or if the post-encoding data length is not greater than the preset threshold, segmenting, by the transmit end, the to-be-encoded data into one code block.

In a possible design, the obtaining, by the transmit end, a segment quantity of the to-be-encoded data based on the post-encoding data length and the preset threshold includes:

obtaining, by the transmit end, the segment quantity by using the following formula 1:

$$C = \lceil S_A / Z \rceil \qquad \text{formula 1,}$$

where

C is the segment quantity, C is a positive integer, $S_A$ is the post-encoding data length, Z is the preset threshold, and $\lceil \cdot \rceil$ is a rounding-up operation.

In a possible design, the C code blocks include $C_+$ first kind of code block(s) and $C_-$ second kind of code block(s), $C = C_+ + C_-$, a pre-encoding length of the first kind of code block is $K_+$, a pre-encoding length of the second kind of code block is $K_-$, $K_- = K_+ - P$, $P \geq 1$, and P is an odd number.

In a possible design, the pre-encoding length $K_+$ of the first kind of code block is determined based on a length of check information in a code block, a length of the to-be-encoded data, and the segment quantity. After $K_+$ is obtained, $K_-$ may be obtained based on $K_- = K_+ - P$.

In a possible design, the pre-encoding length $K_+$ of the first kind of code block is determined by using the following formula 2:

$$K_+ = \lceil (S_{TB} + C \times l_{CB}) / C \rceil \qquad \text{formula 2,}$$

where $S_{TB}$ is the length of the to-be-encoded data, $l_{CB}$ is the length of check information in a code block, and $\lceil \cdot \rceil$ is a rounding-up operation.

In a possible design, a quantity $C_-$ of the second kind of code block(s) is determined based on the pre-encoding length $K_+$ of the first kind of code block, the pre-encoding length $K_-$ of the second kind of code block, and a length of the to-be-encoded data. After $C_-$ is obtained, $C_+$ may be obtained based on $C = C_+ + C_-$.

In a possible design, the quantity $C_-$ of the second kind of code block(s) is determined by using the following formula 3:

$$C_- = \lfloor (C \times K_+ - S_{TB} - C \times l_{CB}) / P \rfloor \qquad \text{formula 3,}$$

where $K_+$ is the pre-encoding length of the first kind of code block, $K_-$ is the pre-encoding length of the second kind of code block, $S_{TB}$ is the length of the to-be-encoded data, $l_{CB}$ is a length of check information in a code block, and $\lfloor \cdot \rfloor$ is a rounding-down operation.

In a possible design, the obtaining, by a transmit end, a post-polar-encoding data length corresponding to to-be-encoded data includes:

obtaining, by the transmit end, the post-encoding data length based on a rate matching processing procedure on the to-be-encoded data.

According to a second aspect, an embodiment of this application provides a decoding method, including:

after to-be-decoded data is obtained, obtaining, by a receive end, a length of the to-be-decoded data;

segmenting, by the receive end, the to-be-decoded data into at least one decode block based on the length of the to-be-decoded data and a preset threshold; and performing, by the receive end, polar decoding on each decode block, to obtain decoded data.

In a possible design, the segmenting, by the receive end, the to-be-decoded data into at least one decode block based on the length of the to-be-decoded data and a preset threshold includes:

obtaining, by the receive end, a segment quantity of the to-be-decoded data based on the length of the to-be-decoded data and the preset threshold; and segmenting, by the receive end, the to-be-decoded data into at least one decode block based on the segment quantity.

In a possible design, the segmenting, by the receive end, the to-be-decoded data into at least one decode block based on the length of the to-be-decoded data and a preset threshold includes:

determining, by the receive end, whether the length of the to-be-decoded data is greater than the preset threshold; and if the length of the to-be-decoded data is greater than the preset threshold, obtaining, by the receive end, a segment quantity of the to-be-decoded data based on the length of the to-be-decoded data and the preset threshold, and segmenting the to-be-decoded data into at least two decode blocks based on the segment quantity; or if the length of the to-be-decoded data is not greater than the preset threshold, segmenting, by the receive end, the to-be-decoded data into one decode block.

In a possible design, the obtaining, by the receive end, a segment quantity of the to-be-decoded data based on the length of the to-be-decoded data and the preset threshold includes:

obtaining, by the receive end, the segment quantity by using the following formula 4:

$$C=\lceil S_B/Z \rceil \qquad \text{formula 4,}$$

where

C is the segment quantity, C is a positive integer, $S_B$ is the length of the to-be-decoded data, Z is the preset threshold, and $\lceil \cdot \rceil$ is a rounding-up operation.

In a possible design, the C decode blocks include $C_+$ first kind of decode block(s) and $C_-$ second kind of decode block(s), $C=C_++C_-$, a post-decoding length of the first kind of decode block is $K_+$, a post-decoding length of the second kind of decode block is $K_-$, $K_-=K_+-P, P\geq 1$, and P is an odd number.

In a possible design, the post-decoding length $K_+$ of the first kind of decode block is determined based on a length of check information in a decode block, a post-decoding data length, and the segment quantity.

In a possible design, the post-decoding length $K_+$ of the first kind of decode block is determined by using the following formula 5:

$$K_+=\lceil (S_{TB}+C\times l_{CB})/C \rceil \qquad \text{formula 5,}$$

where $S_{TB}$ is the post-decoding data length, $l_{CB}$ is the length of check information in a decode block, and $\lceil \cdot \rceil$ is a rounding-up operation.

In a possible design, a quantity $C_-$ of the second kind of decode block(s) is determined based on the post-decoding length $K_+$ of the first kind of decode block, the post-decoding length $K_-$ of the second kind of decode block, and a post-decoding data length.

In a possible design, the quantity $C_-$ of the second kind of decode block(s) is determined by using the following formula 6:

$$C_-=\lfloor (C\times K_+-S_{TB}-C\times l_{CB})/P \rfloor \qquad \text{formula 6,}$$

where $K_+$ is the post-decoding length of the first kind of decode block, $K_-$ is the post-decoding length of the second kind of decode block, $S_{TB}$ is the post-decoding data length, $l_{CB}$ is a length of check information in a decode block, and $\lfloor \cdot \rfloor$ is a rounding-down operation.

In a possible design, the obtaining a length of the to-be-decoded data includes:

obtaining, by the receive end, the length of the to-be-decoded data based on a modulation and coding scheme and time-frequency resources.

According to a third aspect, an embodiment of this application provides an encoding device. The encoding device may implement the functions performed by the transmit end in the foregoing method embodiment. The functions may be implemented by hardware, or may be implemented by executing corresponding software by hardware. The hardware or software includes one or more modules corresponding to the foregoing functions.

According to a fourth aspect, an embodiment of this application provides a decoding device. The decoding device may implement the functions performed by the receive end in the foregoing method embodiment. The functions may be implemented by hardware, or may be implemented by executing corresponding software by hardware. The hardware or software includes one or more modules corresponding to the foregoing functions.

In specific implementation of the foregoing encoding device, a computer program and a memory may be further included. The computer program is stored in the memory. A processor runs the computer program to perform the foregoing encoding method. There is at least one processor that is configured to execute an executable instruction, that is, the computer program, stored in the memory. Optionally, the memory may alternatively be integrated into the processor.

In specific implementation of the foregoing decoding device, a computer program and a memory may be further included. The computer program is stored in the memory. The processor runs the computer program to perform the foregoing decoding method. There is at least one processor that is configured to execute an executable instruction, that is, the computer program, stored in the memory. Optionally, the memory may alternatively be integrated into the processor.

According to a fifth aspect, this application further provides a storage medium, including a readable storage medium and a computer program. The computer program is configured to perform an encoding method of an encoding device side.

According to a sixth aspect, this application further provides a storage medium, including a readable storage medium and a computer program. The computer program is configured to perform a decoding method of a decoding device side.

According to a seventh aspect, this application further provides a program product. The program product includes a computer program (that is, an executable instruction). The computer program is stored in a readable storage medium. At least one processor of an encoding device may read the computer program from the readable storage medium. The at least one processor executes the computer program so that the encoding device performs the encoding method provided in the foregoing implementations.

According to an eighth aspect, this application further provides a program product. The program product includes a computer program (that is, an executable instruction). The computer program is stored in a readable storage medium. At least one processor of a decoding device may read the computer program from the readable storage medium. The at least one processor executes the computer program so that the decoding device performs the decoding method provided in the foregoing implementations.

According to a ninth aspect, an embodiment of this application provides user equipment. The user equipment may either act as an encoding device to implement the functions performed by the foregoing transmit end, or act as a decoding device to implement the functions performed by the foregoing receive end. A structure of the user equipment includes a processor, a transmitter/receiver, an encoder, and a decoder. The processor is configured to support the user equipment in performing the corresponding functions in the foregoing method. The transmitter/receiver is configured to support communication between the user equipment and a base station. The encoder is configured to encode a code block. The decoder is configured to decode a decode block. The user equipment may further include a memory. The memory is coupled to the processor, and is configured to store a program instruction and data of the user equipment.

According to a tenth aspect, an embodiment of this application provides a base station. The base station may either act as an encoding device to implement the functions performed by the foregoing transmit end, or act as a decoding device to implement the functions performed by the foregoing receive end. A structure of the base station includes a processor, a transmitter/receiver, an encoder, and a decoder. The processor is configured to support the base station in performing the corresponding functions in the foregoing method. The transmitter/receiver is configured to support communication between user equipment and the base station. The encoder is configured to encode a code block. The decoder is configured to decode a decode block. The base station may further include a memory. The memory is coupled to the processor, and is configured to store a program instruction and data of the base station.

According to the encoding and decoding method and device provided in the embodiments of this application, the transmit end obtains the post-polar-encoding data length corresponding to the to-be-encoded data, and segments the to-be-encoded data into the at least one code block based on the post-encoding data length and the preset threshold because polar encoding does not constrain an input code length. The transmit end performs polar encoding on each code block, and transmits the encoded data to the receive end. Compared with turbo code segmentation in the prior art, this obviously reduces a segment quantity, avoiding a data transmission performance loss caused by an excessive quantity of segments.

DESCRIPTION OF EMBODIMENTS

A network architecture and a service scenario described in the embodiments of this application are intended to describe the technical solutions in the embodiments of this application more clearly, and do not constitute any limitation on the technical solutions provided in the embodiments of this application. Persons of ordinary skill in the art may understand that with the evolution of network architectures and the emergence of new service scenarios, the technical solutions provided in the embodiments of this application are also applicable to similar technical problems.

Figure 1:
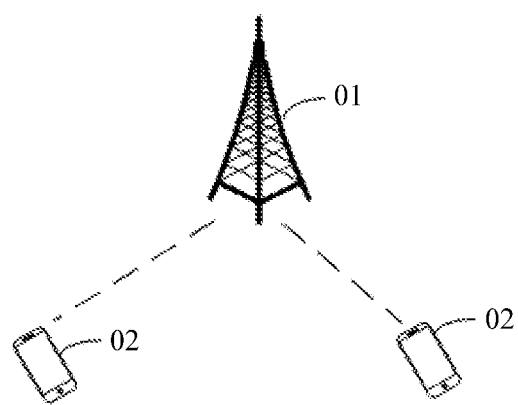
FIG. 1 shows a network architecture that may be applicable to an embodiment of this application.

The following describes, with reference to FIG. 1, a network architecture that may be applicable to an embodiment of this application. FIG. 1 shows a network architecture that may be applicable to an embodiment of this application. As shown in FIG. 1, the network architecture provided in this embodiment includes a base station 01 and user equipment (UE) 02. The UE in this embodiment of this application may include various handheld devices, in-vehicle devices, wearable devices, and computing devices that have a wireless communication function, or another processing device connected to a wireless modem, various forms of terminal devices, a mobile station (MS), and the like. The base station (BS) in this embodiment of this application is a network device deployed in a radio access network to provide a wireless communication function for the UE. The base station may include various forms of macro base stations, micro base stations, relay stations, access points, and the like. Persons skilled in the art may understand that another network device requiring encoding and decoding may also use the method provided in this application, and this embodiment is not limited to a base station.

The following transmit end and receive end in this embodiment may be the foregoing base station and UE. When the base station is the transmit end, the corresponding receive end is the UE, and the base station sends downlink data to the UE. When the UE is the transmit end, the corresponding receive end is the base station, and the UE sends uplink data to the base station.

Further, in a data transmission process, when the transmit end sends data, there is a maximum of one transport block (TB) within each transmission time interval. Each transport block undergoes cyclic redundancy check (CRC) code addition and then the code block segmentation is performed. A CRC code is added to each code block. Finally, each code block is transmitted to the receive end after undergoing procedures such as channel encoding.

After receiving to-be-decoded data sent by the transmit end, the receive end segments the to-be-decoded data into decode blocks, then performs decoding and CRC check on each decode block, and then performs CRC check on decoded data that is obtained from all the decode blocks, to obtain the data sent by the transmit end.

For the foregoing code block segmentation process, the embodiments provide an encoding and decoding method, to resolve a prior-art problem that, due to a restriction of a turbo code interleaver, a large quantity of turbo codes have to be segmented into a plurality of code segments, resulting in an unnecessary performance loss.

To describe implementations of the embodiments easily, the embodiments separately describe the encoding method and the decoding method in detail.

Figure 2:
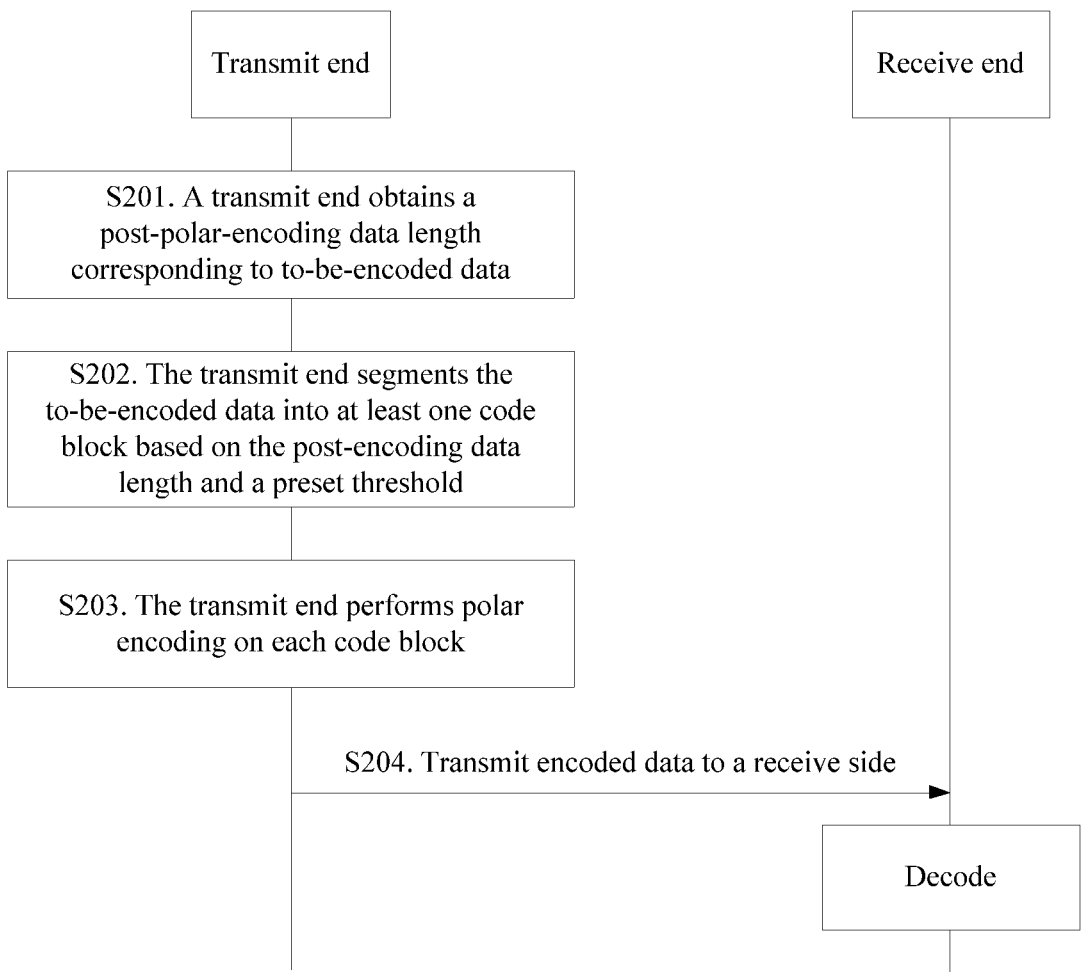
FIG. 2 is a signaling flowchart of an encoding method according to an embodiment of this application.

FIG. 2 is a signaling flowchart of an encoding method according to an embodiment of this application. As shown in FIG. 2, the method provided in this application includes the following steps.

S201. A transmit end obtains a post-polar-encoding data length corresponding to to-be-encoded data.

In this embodiment, a polar encoding method is used to encode the to-be-encoded data. In a process of polar encoding, a rate matching procedure is completed, which does not have a requirement on an input bit length of an interleaver. In other words, polar encoding does not constrain an input code length.

Specifically, after the to-be-encoded data is obtained, the post-polar-encoding data length needs to be obtained first. In this embodiment, a modulation and coding scheme (MCS), a modulation order, time-frequency resources, and the like may be obtained from a preset table in an existing communications protocol, so as to obtain a post-rate-matching data length. This data length is the post-polar-encoding data length.

Persons skilled in the art may understand that the to-be-encoded data in this embodiment includes check information, and the check information may be, for example, a CRC code. Optionally, the to-be-encoded data in this embodiment may be a transport block TB, and accordingly, the transport block includes a TB-level CRC code.

S202. The transmit end segments the to-be-encoded data into at least one code block based on the post-encoding data length and a preset threshold.

In this embodiment, the post-encoding data length is used for segmenting the to-be-encoded data. Specifically, the post-encoding data length may be compared with the preset threshold, and the to-be-encoded data is segmented into at least one code block based on a comparison result.

The preset threshold may be preset by a system. During initial setting, a same preset threshold is configured at both the transmit end and a receive end. The preset threshold may be understood as a post-encoding maximum data length of the code block.

When the post-encoding data length is less than the preset threshold, the to-be-encoded data is segmented into one code block, which means that no segmentation operation is performed. When the post-encoding data length is greater than the preset threshold, the to-be-encoded data is segmented, to obtain at least two code blocks. For example, a rounding-up operation may be performed on a result of dividing the post-encoding data length by the preset threshold, to obtain a segment quantity.

Persons skilled in the art may understand that a length of a code block in this embodiment is a pre-encoding length, including a length of to-be-encoded data corresponding to the code block and a length of check information. The check information is check information at a code block (CB) level. The CB-level check information may be, for example, a CRC code.

S203. The transmit end performs polar encoding on each code block.

S204. The transmit end transmits encoded data to a receive end.

After segmentation is completed, each code block is encoded. Specifically, each code block may be corresponding to an encoder. Each encoder performs polar encoding on a code block corresponding to the encoder. After encoding is completed, the encoded data is sent to the receive end. The receive end performs decoding and CRC check, and finally obtains data originally sent by the transmit end.

A specific example (Embodiment 1) is used. Under the current LTE (Long Term Evolution) standard, when an MCS is 14, a modulation order is 4, and a quantity of resource blocks is 26. According to the preset table in the existing protocol, when the quantity of RBs is 26, a TB size is 6172. In other words, the length of the to-be-encoded data is 6172.

Therefore, a quantity of usable resource elements (RE) may be calculated as follows:

$$\text{REs}=26(\text{RBs})\times12(\text{subcarriers})\times7(OFDM \text{ symbols})\times2$$
$$(\text{timeslots in a subframe})\times 0.9(\text{assuming that}$$
$$10\% \text{ are allocated to a control channel})=3931$$

Based on the modulation order of 4, a post-rate-matching code length is 3931×4=15724. Because a polar encoding process often includes a rate matching procedure, this length is the post-polar-encoding length.

In this embodiment, the CRC code is used. To be specific, a length of the CRC code is used, and this length is l=24.

According to a turbo code segmentation method of the existing LTE technology, the segment quantity is $C_{LTE}=\lceil 6172/(6144-24)\rceil=2$, where 6144 is a maximum length of a turbo code interleaver, that is, a maximum code block size. It can be learned that the TB is segmented into two segments in the prior art.

According to the technical solution provided in this embodiment, if a post-encoding length of a code block is calculated by using a ⅓ bit rate in the LTE standard, the preset threshold is 6144×3=18432, if a maximum code block size equal to that in the prior art is used. Persons skilled in the art may understand that in this embodiment, because segmentation is performed based on the post-encoding length, the preset threshold is corresponding to the post-encoding length of the code block. The post-encoding data length is 15724, less than 18432. Therefore, no segmentation needs to be performed.

It can be learned that under a same condition, when the technical solution provided in this embodiment is used, a segment quantity can be reduced, avoiding a data transmission performance loss caused by an excessive quantity of segments.

According to the method provided in this embodiment, the transmit end obtains the post-polar-encoding data length corresponding to the to-be-encoded data, and segments the to-be-encoded data into the at least one code block based on the post-encoding data length and the preset threshold because polar encoding does not constrain an input code length. The transmit end performs polar encoding on each code block, and transmits the encoded data to the receive end. Compared with turbo code segmentation in the prior art, this obviously reduces a segment quantity, avoiding a data transmission performance loss caused by an excessive quantity of segments.

The following describes in detail, by using a detailed embodiment, the encoding method provided in this embodiment of this application.

In a specific implementation process, a code block segmentation process in this embodiment includes the following two possible implementations.

A feasible implementation is: obtaining, by the transmit end, a segment quantity of the to-be-encoded data based on the post-encoding data length and the preset threshold; and segmenting, by the transmit end, the to-be-encoded data into at least one code block based on the segment quantity.

In a specific implementation process, the transmit end obtains the segment quantity directly by using formula 1:

$$C=\lceil S_A/Z \rceil \qquad \text{formula 1,}$$

where

C is the segment quantity, C is a positive integer, $S_A$ is the post-encoding data length, Z is the preset threshold, and $\lceil \cdot \rceil$ is a rounding-up operation.

In this embodiment, after the post-encoding data length $S_A$ is obtained, the segment quantity is calculated directly by using formula 1. After the rounding-up operation is performed, if C=1, that is, if the segment quantity is 1, there is only one code block, meaning that no segmentation is performed. After the rounding-up operation is performed, if C>1, a smallest segment quantity is 2, meaning that the to-be-encoded data is segmented into at least two segments.

Another feasible implementation is: determining, by the transmit end, whether the post-encoding data length is greater than the preset threshold; and if the post-encoding data length is greater than the preset threshold, obtaining, by the transmit end, a segment quantity of the to-be-encoded data based on the post-encoding data length and the preset threshold, and segmenting the to-be-encoded data into at least two code blocks based on the segment quantity; or if the post-encoding data length is not greater than the preset threshold, segmenting, by the transmit end, the to-be-encoded data into one code block.

In a specific implementation process, whether the post-encoding data length $S_A$ is greater than the preset threshold Z is first determined. If $S_A<Z$, segmentation does not need to be performed, and the to-be-encoded data is segmented into one code block. If $S_A>Z$, the segment quantity is calculated by using the foregoing formula 1. In this case, a smallest segment quantity obtained through calculation is 2. Then, the to-be-encoded data is segmented into the at least two code blocks based on the segment quantity.

Optionally, in formula 1, the C code blocks include $C_+$ first kind of code block(s) and $C_-$ second kind of code block(s), $C=C_++C_-$, a pre-encoding length of the first kind of code block is $K_+$, a pre-encoding length of the second kind of code block is $K_-$, $K_--K_+-P, P \geq 1$, and P is an odd number.

In other words, in this embodiment, after segmentation is completed, two kinds of code blocks are mainly included, namely, the first kind of code block and the second kind of code block. For the first kind of code block, there are specifically $C_+$ segment(s), the pre-encoding length of each first kind of code block is $K_+$, and $K_+$ includes a length of a data part and a length of check information. For the second kind of code block, there are specifically $C_-$ segment(s), the pre-encoding length of each second kind of code block is $K_-$, and $K_-$ includes a length of a data part and a length of check information.

Persons skilled in the art may understand that when C=1, $K_+=S_{TB}$, $C_+=1$, $K_-=0$, $C_-=0$, and when C>1, $K_-$, $K_+$, $C_-$, and $C_+$ may be obtained in the following manner. Specifically, $K_+$ may be obtained based on a length of check information in a code block, a length of the to-be-encoded data, and the segment quantity; then $K_-$ is obtained based on $K_-=K_+-P$; $C_-$ may be determined and obtained based on the pre-encoding length $K_+$ of the first kind of code block, the pre-encoding length $K_-$ of the second kind of code block, and the length of the to-be-encoded data; and then $C_+$ is obtained based on $C=C_++C_-$.

In a feasible implementation, the pre-encoding length $K_+$ of the first kind of code block is determined by using the following formula 2:

$$K_+=\lceil (S_{TB}+C \times l_{CB})/C \rceil \qquad \text{formula 2,}$$

where $S_{TB}$ is the length of the to-be-encoded data, $l_{CB}$ is the length of check information in a code block, and $\lceil \cdot \rceil$ is a rounding-up operation. Persons skilled in the art may understand that another variation of formula 2 is $K_+=\lceil S_{TB}/C+l_{CB} \rceil$.

The quantity $C_-$ of the second kind of code block(s) is determined by using the following formula 3:

$$C_-=\lfloor (C \times K_+-S_{TB}-C \times l_{CB})/P \rfloor \qquad \text{formula 3,}$$

where $K_+$ is the pre-encoding length of the first kind of code block, $K_-$ is the pre-encoding length of the second kind of code block, $S_{TB}$ is the length of the to-be-encoded data, $l_{CB}$ is the length of check information in a code block, and $\lfloor \cdot \rfloor$ is a rounding-down operation.

In this embodiment, because $P \geq 1$ and P is an odd number, when P=1, block error rate (Block Error Rate, BLER) performance of a TB is optimal. In other words, in this embodiment, $K_+$ and $K_-$ whose values are close to each other may be obtained, thereby avoiding a relatively large performance difference between code blocks and an additional post-segmentation performance loss in the prior art that result from a relatively large difference between $K_+$ and $K_-$. The relatively large difference between $K_+$ and $K_-$ is to ensure that a length of each segment fits an interleaver size.

Further, for ease of description, the rounding-down operation is not considered in formula 3, and $C=C_++C_-$ and $K_-=K_+-P$ are substituted into formula 3 to perform the following derivation:

$$C_- \times P = C \times K_+ - S_{TB} - C \times l_{CB}$$

$$C_- \times (K_+-K_-) = (C_++C_-) \times K_+ - S_{TB} - C \times l_{CB}$$

$$C_- \times K_+ - C_- \times K_- = C_+ \times K_+ + C_- \times K_+ - S_{TB} - C \times l_{CB}$$

$$S_{TB}+C \times l_{CB} = C_+ \times K_+ C_- \times K_-$$

It can be learned that because there is no constraint on an input code length in this embodiment, all the to-be-encoded data may be segmented, and no padding bit is required, thereby avoiding a waste of transport resources. However, in the prior art, after segmentation is performed, a padding bit is added to meet a requirement of an interleaver on an input length, but the padding bit neither carries information nor improves channel encoding performance, and needs to occupy precious physical transport resources, resulting in a waste of resources.

The following describes, by using another specific embodiment, beneficial effects of the technical solution provided in this embodiment compared with the prior art. In this embodiment, the check information in a code block may be CRC check information, and $l_{CB}=24$.

Under the current LTE standard, when the MCS is 27, the modulation order is 6, and the quantity of RBs is 26.

This embodiment is a derivation of Embodiment 1 when a CQI (channel quality indicator) is more desirable. According to the preset table in the existing protocol, when the quantity of RBs is 26, the TB size is 12960, meaning that the length of the to-be-encoded data is 6172.

Therefore, a quantity of usable REs may be similarly calculated as follows:

REs=26(RBs)×12(subcarriers)×7(OFDM symbols)×2 (timeslots in a subframe) ×0.9(assuming that 10% are allocated to a control channel)=3931

Based on the modulation order of 6, the post-rate-matching code length is 3931×6 =23586. Because a polar encoding process often includes a rate matching procedure, this length is the post-polar-encoding length.

If the existing LTE segmentation method is used, the segment quantity is $C_{LTE}=\lceil 12960/(6144-24)\rceil=3$.

According to the technical solution provided in this embodiment, if the post-encoding length of the code block is calculated by using a ⅓ bit rate in the LTE standard, the preset threshold is 6144×3=18432, if a maximum code block size equal to that in the prior art is used. Persons skilled in the art may understand that in this embodiment, because segmentation is performed based on the post-encoding length, the preset threshold is corresponding to the post-encoding length of the code block. In this case, the segment quantity is $C_{Polar}=\lceil 23586/18432 \rceil=2$.

It can be learned that under a condition of a same MCS, a same modulation order, and a same quantity of RBs, this technical solution entails a relatively small segment quantity than the existing LTE solution, effectively reducing a data transmission performance loss brought by segmentation.

The length of the first kind of code block(s) is $K_+=\lceil (S_{TB}+C\times l_{CB})/C \rceil = \lceil (12960+2\times 24)/2 \rceil=6492$.

It can be learned from a quantity of second kind of code block(s), $C_-=\lfloor(C\times K_+ - S_{TB} - C\times l_{CB})/P\rfloor=0$, that in this case, $C_+ 2$, meaning that a long code segment with a length of $K_-$ does not exist.

Figure 3:
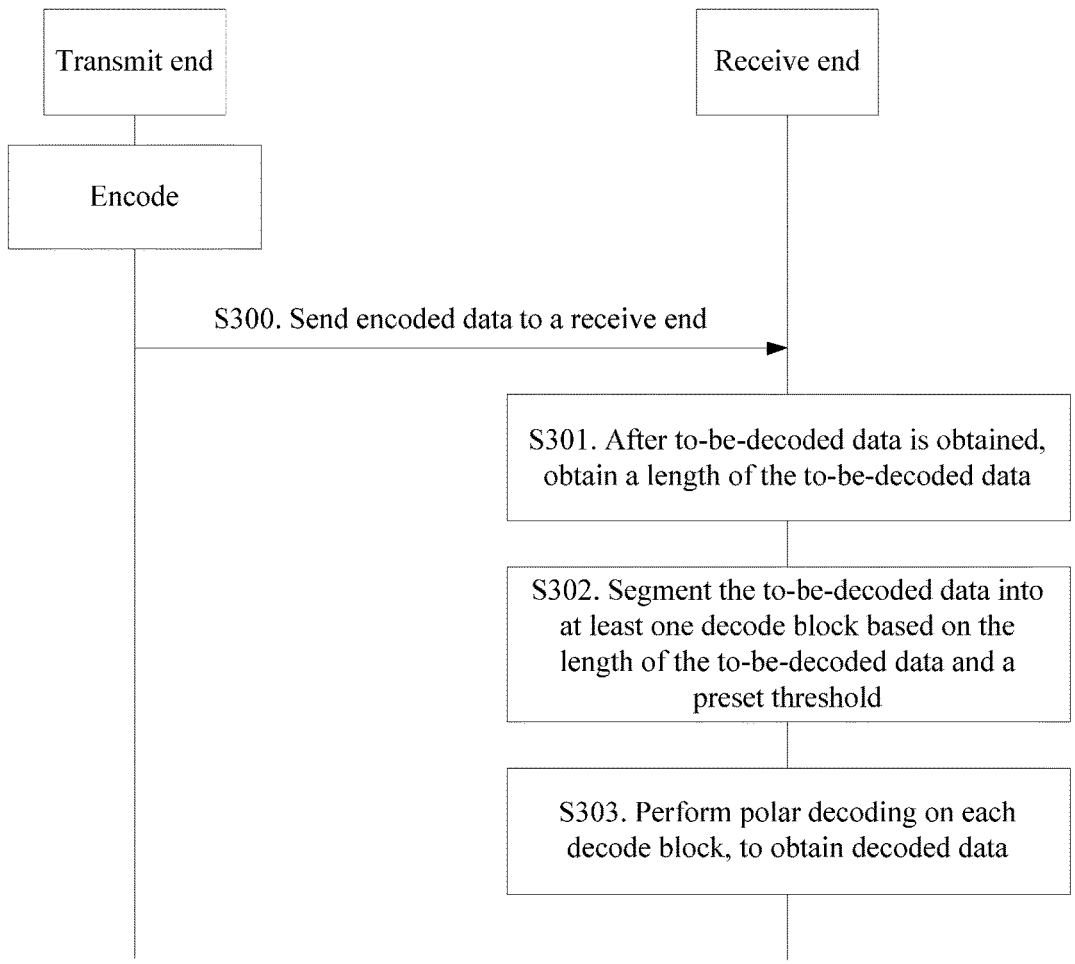
FIG. 3 is a signaling flowchart of a decoding method according to an embodiment of this application.

After the encoding process is described, the following describes in detail, with reference to FIG. 3, a decoding method provided in an embodiment of this application.

FIG. 3 is a signaling flowchart of a decoding method according to an embodiment of this application. As shown in FIG. 3, the method provided in this application includes the following steps.

S300. A receive end receives encoded data sent by a transmit end.

S301. After to-be-decoded data is obtained, the receive end obtains a length of the to-be-decoded data.

S302. The receive end segments the to-be-decoded data into at least one decode block based on the length of the to-be-decoded data and a preset threshold.

S303. The receive end performs polar decoding on each decode block, to obtain decoded data.

After encoding to-be-encoded data, the transmit end in the embodiment shown in FIG. 2 sends the encoded data to the receive end. For the receive end, the encoded data is the to-be-decoded data at the receive end.

After obtaining the to-be-decoded data, the receive end first needs to segment the to-be-decoded data, and then performs decoding on each segment.

Segmenting the to-be-decoded data performed by the receive end is similar to segmenting the to-be-encoded data performed by the transmit end.

After obtaining the to-be-decoded data, the receive end obtains the length of the to-be-decoded data. Specifically, the receive end may obtain an MCS, a modulation order, time-frequency resources, and the like from a preset table in an existing communications protocol, and then obtains the length of the to-be-decoded data. This preset table is the same as a preset table used by the transmit end.

Then, the receive end segments the to-be-decoded data into the at least one decode block based on the length of the to-be-decoded data and the preset threshold.

In this embodiment, an implementation in which the to-be-decoded data is segmented into the at least one decode block is similar to segmentation at the transmit end. Segmentation at both the transmit end and the receive end may be implemented in two possible implementations.

One possible implementation is: obtaining, by the receive end, a segment quantity of the to-be-decoded data based on the length of the to-be-decoded data and the preset threshold; and segmenting the to-be-decoded data into at least one decode block based on the segment quantity.

The other possible implementation is: determining, by the receive end, whether the length of the to-be-decoded data is greater than the preset threshold; and if the length of the to-be-decoded data is greater than the preset threshold, obtaining a segment quantity of the to-be-decoded data based on the length of the to-be-decoded data and the preset threshold, and segmenting the to-be-decoded data into at least two decode blocks based on the segment quantity; or if the length of the to-be-decoded data is not greater than the preset threshold, segmenting the to-be-decoded data into one decode block.

Specific implementation of the foregoing two implementations is similar to the embodiment in FIG. 2, and details are not described herein again in this embodiment.

Optionally, the receive end obtains the segment quantity by using the following formula 4:

$$C=\lceil S_B/Z \rceil \qquad \text{formula 4,}$$

where

C is the segment quantity, C is a positive integer, $S_B$ is the length of the to-be-decoded data, Z is the preset threshold, and $\lceil \cdot \rceil$ is a rounding-up operation.

A difference between formula 4 and formula 1 is that $S_A$ in formula 1 is the post-encoding data length, whereas $S_B$ in formula 4 is the length of the to-be-decoded data. However, the two formulas are corresponding to each other, but one is for encoding and the other is for decoding.

The C decode blocks include $C_+$ first kind of decode block(s) and $C_-$ second kind of decode block(s), $C=C_++C_-$, a post-decoding length of the first kind of decode block is $K_+$, a post-decoding length of the second kind of decode block is $K_-$, $K_-=K_+-P, P\geq 1$, and P is an odd number.

In this embodiment, the first kind of decode block is corresponding to a first kind of code block, and the second kind of decode block is corresponding to a second kind of code block.

The post-decoding length $K_+$ of the first kind of decode block is determined based on a length of check information in a decode block, a post-decoding data length, and the segment quantity, and is specifically determined by using the following formula 5:

$$K_+=\lceil (S_{TB}+C\times l_{CB})/C \rceil \qquad \text{formula 5,}$$

where $S_{TB}$ is the post-decoding data length, $l_{CB}$ is the length of check information in a decode block, and $\lceil \cdot \rceil$ is a rounding-up operation. Persons skilled in the art may understand that another variation of formula 5 is $K_+=\lceil S_{TB}/C+l_{CB} \rceil$.

A quantity $C_-$ of the second kind of decode block(s) is determined based on the post-decoding length $K_+$ of the first kind of decode block, the post-decoding length $K_-$ of the second kind of decode block, and a post-decoding data length, and is specifically determined by using the following formula 6:

$$C_-=\lfloor (C\times K_+ - S_{TB} - C\times l_{CB})/P \rfloor \qquad \text{formula 6,}$$

where $K_+$ is the post-decoding length of the first kind of decode block, $K_-$ is the post-decoding length of the second kind of decode block, $S_{TB}$ is the post-decoding data length, $l_{CB}$ is the length of check information in a decode block, and $\lfloor \cdot \rfloor$ is a rounding-down operation.

In this embodiment, decoding is a relative process to encoding. Therefore, C, $K_+$, $K_-$, $C_+$, $C_-$ and P obtained based on formula 4 to formula 6 are the same as those in the embodiment in FIG. 2. For a specific implementation, refer to the embodiment in FIG. 2, and details are not described herein again in this embodiment.

Persons skilled in the art may understand that in this embodiment, because $K_+$ is the post-decoding length of the first kind of decode block and $K_-$ is the post-decoding length of the second kind of decode block, to segment the to-be-decoded data, a pre-decoding length $M_+$ of the first kind of decode block and a pre-decoding length $M_-$ of the second kind of decode block may be obtained based on correspondences, so as to complete a segmentation process.

Specifically, the pre-encoding length $K_+$ of the first kind of code block is corresponding to the post-encoding length $M_+$, and based on this correspondence, the pre-decoding length $M_+$ of the first kind of decode block, corresponding to the post-decoding length $K_+$ of the first kind of decode block, can be obtained. The pre-encoding length $K_-$ of the second kind of code block is corresponding to the post-encoding length $M_-$, and based on this correspondence, the pre-decoding length $M_-$ of the second kind of decode block, corresponding to the post-decoding length $K_-$ of the second kind of decode block, can be obtained.

After segmentation is completed, each decode block is separately decoded and checked. After each segment passes decoding check, transport block check is performed, and finally original data sent by the transmit end is obtained. In this process, the to-be-encoded data is segmented based on polar encoding and decoding characteristics. Compared with the solution used in the current LTE standard, this can effectively reduce a segment quantity, and mitigate a data transmission performance loss caused by data transmission segmentation. Lengths of code blocks obtained through segmentation are essentially the same, avoiding a TB-level BLER performance loss caused by a relatively large difference between data lengths of the code blocks. In addition, no bit needs to be padded, thereby avoiding a waste of transport resources.

The foregoing describes the solutions provided in the embodiments of this application mainly from a perspective of interaction between the transmit end and the receive end. It can be understood that an encoding device is used as the transmit end, a decoding device is used as the receive end, and to implement the foregoing functions, the encoding device and the decoding device include a corresponding hardware structure and/or a software module that are/is used to perform the functions. The encoding device may be the foregoing base station or user equipment. The decoding device may be the foregoing user equipment or base station. The units and algorithm steps in the examples described with reference to the embodiments disclosed in this application may be implemented by hardware or a combination of hardware and computer software in the embodiments of this application. Whether a function is performed by hardware or in a form of driving hardware by computer software depends on particular applications and design constraint conditions of the technical solutions. Persons skilled in the art may use a different method to implement the described functions for each particular application, but it should not be considered that the implementation goes beyond the scope of the technical solutions of the embodiments of this application.

In the embodiments of this application, function module division may be performed for the encoding device and the decoding device according to the foregoing method examples. For example, function modules may be designed in correspondence to functions, or two or more functions may be integrated into one processing module. The integrated module may be implemented in a form of hardware, or may be implemented in a form of a software function module. It should be noted that the module division in the embodiments of this application is an example, and is merely logical function division and may be other division in actual implementation.

Figure 4:
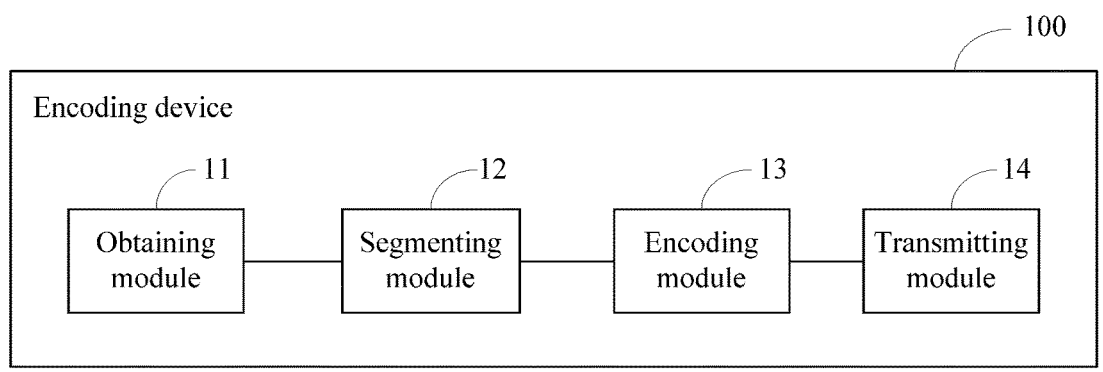
FIG. 4 is a schematic structural diagram of an encoding device according to an embodiment of this application.

FIG. 4 is a schematic structural diagram of an encoding device according to an embodiment of this application. As shown in FIG. 4, this encoding device 100 includes:

an obtaining module 11, configured to obtain a post-polar-encoding data length corresponding to to-be-encoded data;

a segmenting module 12, configured to segment the to-be-encoded data into at least one code block based on the post-encoding data length and a preset threshold;

an encoding module 13, configured to perform polar encoding on each code block; and a transmitting module 14, configured to transmit encoded data to a receive end.

The encoding device according to this embodiment is configured to execute the method embodiment shown in FIG. 2, with a similar implementation principle and similar technical effects. Details are not described herein again in this embodiment.

Optionally, the segmenting module 12 is specifically configured to obtain a segment quantity of the to-be-encoded data based on the post-encoding data length and the preset threshold; and segment the to-be-encoded data into at least one code block based on the segment quantity.

Optionally, the segmenting module 12 is specifically configured to determine whether the post-encoding data length is greater than the preset threshold; and if the post-encoding data length is greater than the preset threshold, obtain a segment quantity of the to-be-encoded data based on the post-encoding data length and the preset threshold, and segment the to-be-encoded data into at least two code blocks based on the segment quantity; or if the post-encoding data length is not greater than the preset threshold, segment the to-be-encoded data into one code block.

Optionally, the obtaining module 11 is specifically configured to obtain the post-encoding data length based on a rate matching processing procedure for the to-be-encoded data.

For a method used by the encoding device provided in this embodiment to perform segmentation and encoding by using the foregoing formula 1 to formula 3, refer to the method shown in the embodiment in FIG. 2, and details are not described herein again in this embodiment.

Figure 5:
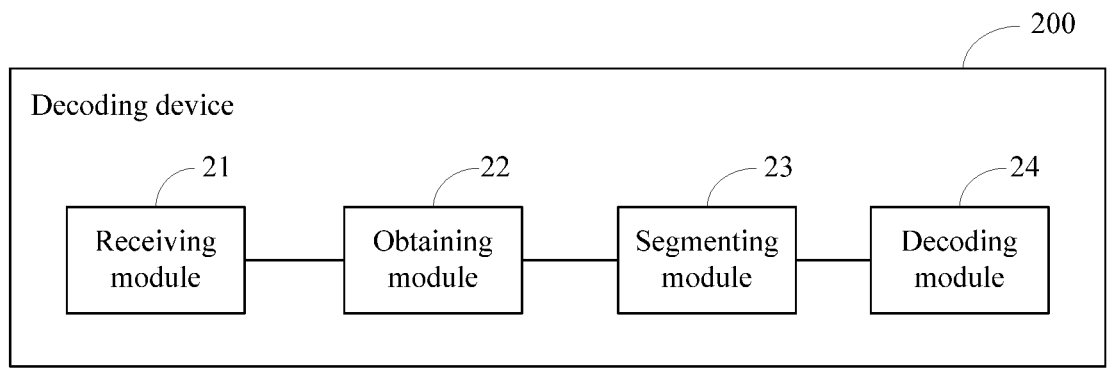
FIG. 5 is a schematic structural diagram of a decoding device according to an embodiment of this application.

FIG. 5 is a schematic structural diagram of a decoding device according to an embodiment of this application. As shown in FIG. 5, this decoding device 200 includes:

a receiving module 21, configured to receive to-be-decoded data sent by a transmit end;

an obtaining module 22, configured to obtain a length of the to-be-decoded data;

a segmenting module 23, configured to segment the to-be-decoded data into at least one decode block based on the length of the to-be-decoded data and a preset threshold; and a decoding module 24, configured to perform polar decoding on each decode block, to obtain decoded data.

The decoding device according to this embodiment is configured to execute the method embodiment shown in FIG. 3, with a similar implementation principle and similar technical effects. Details are not described herein again in this embodiment.

Optionally, the segmenting module 23 is specifically configured to obtain a segment quantity of the to-be-decoded data based on the length of the to-be-decoded data and the preset threshold; and segment the to-be-decoded data into at least one decode block based on the segment quantity.

Optionally, the segmenting module 23 is specifically configured to determine whether the length of the to-be-decoded data is greater than the preset threshold; and if the length of the to-be-decoded data is greater than the preset threshold, obtain a segment quantity of the to-be-decoded data based on the length of the to-be-decoded data and the preset threshold, and segment the to-be-decoded data into at least two decode blocks based on the segment quantity; or if the length of the to-be-decoded data is not greater than the preset threshold, segment the to-be-decoded data into one decode block.

Optionally, the obtaining module 22 is specifically configured to obtain the length of the to-be-decoded data based on a modulation and coding scheme and time-frequency resources.

For a method used by the decoding device provided in this embodiment to perform segmentation and decoding by using the foregoing formula 4 to formula 6, refer to the method shown in the embodiment in FIG. 3, and details are not described herein again in this embodiment.

A base station or user equipment provided in the embodiments may either be used as an encoding device, or may be used as a decoding device. Hardware structures of the base station and the user equipment are described in the following embodiments in detail.

Figure 6:
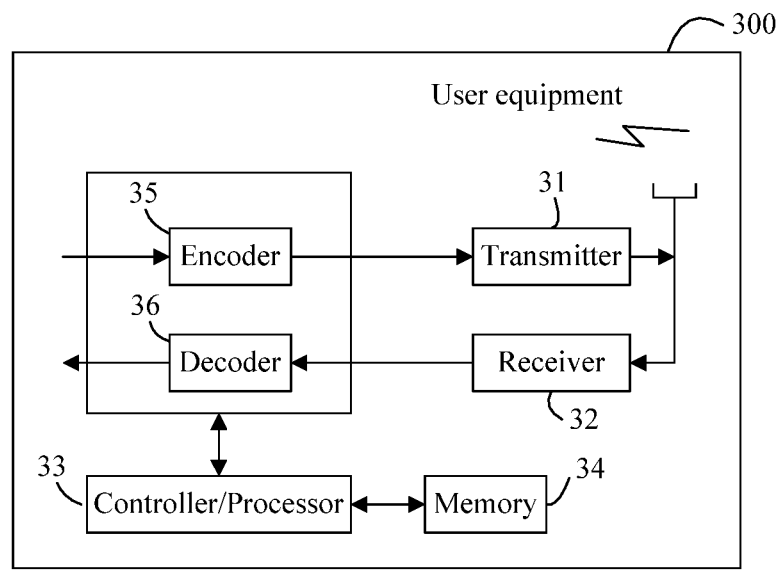
FIG. 6 is a hardware structure diagram of user equipment according to an embodiment of this application.

FIG. 6 is a hardware structure diagram of user equipment according to an embodiment of this application. The user equipment 300 includes a transmitter 31, a receiver 32, and a processor 33. The processor 33 may alternatively be a controller, and is represented as "Controller/Processor 33" in FIG. 6. The user equipment 300 may further include an encoder 35, a decoder 36, and a memory 34.

In an example, the transmitter 31 regulates an output sample and generates an uplink signal. The uplink signal is transmitted to the base station in the foregoing embodiment by using an antenna. On a downlink, the antenna receives a downlink signal transmitted by the base station in the foregoing embodiment. The receiver 32 regulates (for example, performing filtering, amplification, down conversion, and digitalization on) the signal received from the antenna and provides an input sample. The encoder 35 is configured to encode each code block. The decoder 36 is configured to decode a decode block.

The memory 34 is configured to store program code and data of the user equipment 300. The processor 33 controls and manages an action performed by the user equipment 300, and may call the program code stored in the memory 34, to execute a processing process that is performed by the user equipment 300 in the foregoing embodiment of this application, for example, the process shown in FIG. 2 or FIG. 3.

Figure 7:
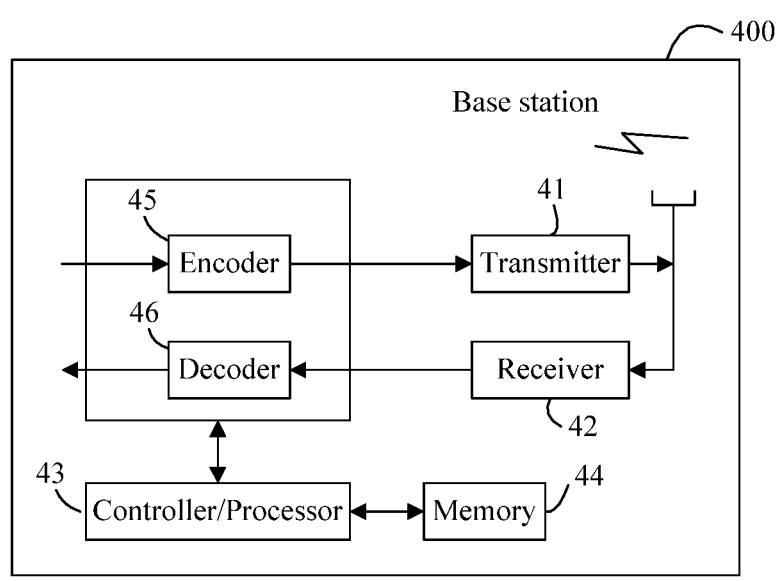
FIG. 7 is a hardware structure diagram of a base station according to an embodiment of this application.

FIG. 7 is a hardware structure diagram of a base station according to an embodiment of this application. The base station 400 includes a transmitter 41, a receiver 42, and a processor 43. The processor 43 may alternatively be a controller, and is represented as "Controller/Processor 43" in FIG. 7. The base station 400 may further include an encoder 45, a decoder 46, and a memory 44.

On an uplink, an uplink signal from user equipment is received by an antenna, is demodulated (for example, a high frequency signal is demodulated into a baseband signal) by the receiver 42, and is further processed by the processor 43 to restore service data and signaling information sent by the user equipment. On a downlink, service data and a signaling message are processed by the processor 43, and is modulated (for example, a baseband signal is modulated into a high frequency signal) by the transmitter 41 to generate a downlink signal, and the downlink signal is transmitted to the user equipment by using the antenna. The encoder 45 is configured to encode each code block. The decoder 46 is configured to decode a decode block.

The memory 44 is configured to store program code and data of the base station 400. The processor 43 controls and manages an action performed by the base station 400, and may call the program code stored in the memory 44, to execute a processing process that is performed by the base station 400 in the foregoing embodiment of this application, for example, the process shown in FIG. 2 or FIG. 3.

In addition, in specific implementation of the foregoing encoding device, a computer program and a memory may be further included. The computer program is stored in the memory. The processor runs the computer program to perform the foregoing encoding method. There is at least one processor that is configured to execute an executable instruction, that is, the computer program, stored in the memory. Optionally, the memory may alternatively be integrated into the processor.

In specific implementation of the foregoing decoding device, a computer program and a memory may be further included. The computer program is stored in the memory. The processor runs the computer program to perform the foregoing decoding method. There is at least one processor that is configured to execute an executable instruction, that is, the computer program, stored in the memory. Optionally, the memory may alternatively be integrated into the processor.

This application further provides a storage medium, including a readable storage medium and a computer program. The computer program is configured to perform an encoding method of an encoding device side.

This application further provides a storage medium, including a readable storage medium and a computer program. The computer program is configured to perform a decoding method of a decoding device side.

This application further provides a program product. The program product includes a computer program (that is, an executable instruction). The computer program is stored in a readable storage medium. At least one processor of an encoding device may read the computer program from the readable storage medium. The at least one processor executes the computer program so that the encoding device performs the encoding method provided in the foregoing implementations.

This application further provides a program product. The program product includes a computer program (that is, an executable instruction). The computer program is stored in a readable storage medium. At least one processor of a decoding device may read the computer program from the readable storage medium. The at least one processor executes the computer program so that the decoding device performs the decoding method provided in the foregoing implementations.

What is claimed is:

1. A method for transmitting data in wireless communications, comprising:
   obtaining, by a transmitting device, to-be-encoded data;
   obtaining, by the transmitting device, a post-polar-encoding data length corresponding to the to-be-encoded data;
   segmenting, by the transmitting device, the to-be-encoded data into a C number of code blocks if the post-polar-encoding data length is greater than a preset threshold, wherein the C number of code blocks is a positive integer equal to or larger than 2; and
   performing, by the transmitting device, polar encoding on each of the C number of code blocks to obtain polar encoded data of the post-polar-encoding data length; and
   transmitting, by the transmitting device, the polar encoded data.

2. The method according to claim 1,
   wherein the C number of code blocks is determined based on:
   $C = \lceil S_A/Z \rceil$, wherein $S_A$ is the post-polar-encoding data length, Z is the preset threshold, and $\lceil \cdot \rceil$ is a rounding-up operation.

3. The method according to claim 1, wherein the C number of code blocks comprise a $C_+$ first kind of code block(s) and a $C_-$ second kind of code block(s), $C = C_+ + C_-$, a pre-encoding length of the first kind of code block is $K_+$, a pre-encoding length of the second kind of code block is $K_-$, $K_- = K_+ - P$, $P \geq 1$, and P is an odd number.

4. The method according to claim 3, wherein the pre-encoding length $K_+$ of the first kind of code block is determined based on a check information length of check information in a code block, on a length of the to-be-encoded data, and on the C number of blocks.

5. The method according to claim 4, wherein the pre-encoding length $K_+$ of the first kind of code block is determined based on:
   $K_+ = \lceil (S_{TB} + C \times l_{CB})/C \rceil$, where $S_{TB}$ is the length of the to-be-encoded data, $l_{CB}$ is the length of check information in a code block, and $\lceil \cdot \rceil$ is a rounding-up operation.

6. The method according to claim 3, wherein a quantity $C_-$ of the second kind of code block(s) is determined based on the pre-encoding length $K_+$ of the first kind of code block, the pre-encoding length $K_-$ of the second kind of code block, and a length of the to-be-encoded data.

7. The method according to claim 1, further comprising:
   performing a cyclic redundancy check on each code block of the C number of code blocks before polar encoding the each code block.

8. The non-transitory computer readable medium according to claim 1, wherein the computer instructions, when executed by one or more processors, further causing the following step to be performed: performing cyclic redundancy check on each code block of the C number of code blocks before polar encoding the each code block.

9. A transmitting device, comprising:
   a memory storing instructions; and
   at least one processor in communication with the memory and configured to execute the instructions to cause the transmitting device to perform:
   obtaining to-be-encoded data;
   obtaining a post-polar-encoding data length corresponding to the to-be-encoded data;
   segmenting the to-be-encoded data into a C number of code blocks if the post-polar-encoding data length is greater than a preset threshold, wherein the C number of code blocks is a positive integer equal to or larger than 2;
   performing polar encoding on each of the C number of code blocks to obtain polar encoded data of the post-polar-encoding data length; and
   transmitting the polar encoded data.

10. The transmitting device according to claim 9, wherein the C number of code blocks is determined based on:
    $C = \lceil S_A/Z \rceil$, wherein $S_A$ is the post-polar-encoding data length, Z is the preset threshold, and $\lceil \cdot \rceil$ is a rounding-up operation.

11. The transmitting device according to claim 9, wherein the C number of code blocks comprise a $C_+$ first kind of code block(s) and a $C_-$ second kind of code block(s), $C = C_+ + C_-$, a pre-encoding length of the first kind of code block is $K_+$, a pre-encoding length of the second kind of code block is $K_-$, $K_- = K_+ - P$, $P \geq 1$, and P is an odd number.

12. The transmitting according to claim 11, wherein the pre-encoding length $K_+$ of the first kind of code block is determined based on a check information length of check information in a code block, on a length of the to-be-encoded data, and on the C number of code blocks.

13. The transmitting device according to claim 12, wherein the pre-encoding length $K_+$ of the first kind of code block is determined based on:
    $K_+ = \lceil (S_{TB} + C \times l_{CB})/C \rceil$, where $S_{TB}$ is the length of the to-be-encoded data, $l_{CB}$ is the length of check information in a code block, and $\lceil \cdot \rceil$ is a rounding-up operation.

14. The transmitting device according to claim 11, wherein a quantity $C_-$ of the second kind of code block(s) is determined based on the pre-encoding length $K_-$ of the first kind of code block, the pre-encoding length $K_-$ of the second kind of code block, and a length of the to-be-encoded data.

15. The transmitting device according to claim 14, wherein the quantity $C_-$ of the second kind of code block(s) is determined based on:
    $C_- = \lfloor (C \times K_+ - S_{TB} - C \times l_{CB})/P \rfloor$ where $K_+$ is the pre-encoding length of the first kind of code block, $K_-$ is the pre-encoding length of the second kind of code block, $S_{TB}$ is the length of the to-be-encoded data, $l_{CB}$ is a length of check information in a code block, and $\lfloor \cdot \rfloor$ is a rounding-down operation.

16. The transmitting device according to claim 9, wherein the processor is further configured to execute the instructions to cause the transmitting device to perform a cyclic redundancy check on each code block of the C number of code blocks before polar encoding the each code block.

17. A non-transitory computer readable medium storing computer instructions, when executed by one or more processors, causing the following steps to be performed:
    obtaining to-be-encoded data;
    obtaining a post-polar-encoding data length corresponding to the to-be-encoded data;
    segmenting the to-be-encoded data into a C number of code blocks if the post-polar-encoding data length is greater than a preset threshold, wherein the C number of code blocks is a positive integer is equal to or larger than 2;

performing polar encoding on each code block of the C number of code blocks to obtain polar encoded data of the post-polar-encoding data length; and transmitting the polar encoded data.

18. The non-transitory computer readable medium according to claim 17, wherein the C number of code blocks comprise a $C_+$ first kind of code block(s) and a $C_-$ second kind of code block(s), $C = C_+ + C_-$, a pre-encoding length of the first kind of code block is $K_+$, a pre-encoding length of the second kind of code block is $K_-$, $K_- = K_+ - P$, $P \geq 1$, and P is an odd number.

19. The non-transitory computer readable medium according to claim 18 wherein the pre-encoding length K+ of the first kind of code block is determined based on a check information length of check information in a code block, on a length of the to-be-encoded data, and on the C number of code blocks.

20. The non-transitory computer readable medium according to claim 19, wherein the pre-encoding length $K_+$ of the first kind of code block is determined based on:

$K_+ = \lceil (S_{TB} + C \times l_{CB})/C \rceil$, where $S_{TB}$ is the length of the to-be-encoded data, $l_{CB}$ is the length of check information in a code block, and $\lceil \cdot \rceil$ is a rounding-up operation.

* * * * *

UNITED STATES PATENT AND TRADEMARK OFFICE
CERTIFICATE OF CORRECTION

PATENT NO.       : 10,389,485 B2                                   Page 1 of 1
APPLICATION NO.  : 16/110908
DATED            : August 20, 2019
INVENTOR(S)      : Zhou et al.

It is certified that error appears in the above-identified patent and that said Letters Patent is hereby corrected as shown below:

In the Specification

Column 2, Line 31: replace "$K_-=K_+-P, P\geq1$," with --$K_-=K_+-P, P\geq1$,--
Column 3, Line 44: replace "is B" with --is--
Column 3, Line 51: replace "$K_-=K_+-P, P\geq1$," with --$K_-=K_+-P, P\geq1$,--
Column 9, Line 44: replace "$K_-=K_+-P, P\geq1$," with --$K_-=K_+-P, P\geq1$,--
Column 11, Line 9: replace "CLTE" with --$C_{LTE}$--
Column 11, Line 30: replace "$C_+2$," with --$C_+=2$,--
Column 12, Line 42: replace "$K_-=K_+-P, P\geq1$," with --$K_-=K_+-P, P\geq1$,--

In the Claims

Claim 3, Line 35: replace "$C_+$first" with --$C_+$ first--
Claim 3, Line 36: replace "$C_-$second" with --$C_-$ second--
Claim 4, Line 41: replace "$K_+$of" with --$K_+$ of--
Claim 5, Line 46: replace "$K_+$of" with --$K_+$ of--
Claim 14, Line 40: replace "$K_-$" with --$K_+$--
Claim 15, Line 46: replace "$C_-=\lfloor(C \times K_+-STB-C\times1_{CB})/P\rfloor$" with --$C_-=\lfloor(C \times K_+-STB-C\times1_{CB})/P\rfloor$,--
Claim 19, Line 13: replace "18" with --18,--
Claim 19, Line 13: replace "K+" with --$K_+$--

Signed and Sealed this
Eleventh Day of October, 2022

*Katherine Kelly Vidal*

Katherine Kelly Vidal
*Director of the United States Patent and Trademark Office*